United States Patent [19]

Fukui et al.

[11] 4,417,156
[45] Nov. 22, 1983

[54] GATE CIRCUIT FOR THYRISTORS

[75] Inventors: Hiroshi Fukui; Shin Kimura; Kenichi Onda; Hisao Amano, all of Hitachi, Japan

[73] Assignee: Hitachi, Ltd., Tokyo, Japan

[21] Appl. No.: 238,605

[22] Filed: Feb. 26, 1981

[30] Foreign Application Priority Data

Feb. 28, 1980 [JP]  Japan .................................. 55-24849

[51] Int. Cl.³ ........................................... H03K 17/72
[52] U.S. Cl. ............................ 307/252 C; 307/252 J; 307/305
[58] Field of Search ............ 307/252 A, 252 C, 252 J, 307/252 N, 252 UA, 305; 323/279, 282; 363/68

[56] References Cited

U.S. PATENT DOCUMENTS 3,728,557  4/1973  Pelly et al. ...................... 307/252 N
3,793,537  2/1974  Stringer .......................... 307/252 N Primary Examiner—John Zazworsky
Attorney, Agent, or Firm—Antonelli, Terry & Wands

[57] ABSTRACT

A gate circuit for a thyristor is disclosed which includes a power supply for feeding gate-on current through a gate and cathode of the thyristor, a switching circuit connected in series with the power supply to turn the gate-on current on or off, and a diode connected between a gate ignition signal input terminal of said switching circuit and the anode of said thyristor with the cathode of said diode being coupled to said anode of said thyristor and the anode of said diode coupled to said switching circuit.

6 Claims, 6 Drawing Figures

GATE CIRCUIT FOR THYRISTORS

This invention relates to a gate circuit for thyristors and in particular, a gate circuit of the type which employs a narrow width or duration pulse for turning on the gate of thyristor (hereinafter referred to as narrow width gate-on pulse gate circuit).

Usually, a gate circuit of the type which employs a wide width pulse for turning on the gate of thyristor (hereinafter referred to as wide width gate-on pulse gate circuit) is used as a motor driving inverter because when the inverter is connected with a load of a lagging power factor and hence thyristors constituting the inverter are applied with lagging voltages, a narrow width gate-on pulse gate circuit tends to failure to ignite the thyristors. However, with the wide width gate-on pulse gate circuit wherein the thyristor is rendered on during the pulse width or duration of a gate-on signal, time for conduction of gate current is inevitably prolonged by the gate-on signal. Consequently, large power consumption occurs in the gate and cost of the gate circuit rises. Use of the narrow width gate-on pulse gate circuit has then been thought of wherein a narrow width pulse is applied to the gate of the thyristor when forward voltage across the anode and cathode of the thyristor is detected. This narrow width gate-on pulse gate circuit can reduce the conduction time of gate current and minimize power consumption in the gate. The narrow gate-on pulse having a pulse width of about several microseconds, identical to turn-on time of the thyristor, is actually sufficient to turn on the gate. In a narrow width gate-on pulse gate circuit conventionally used, however, a narrow gate signal having a pulse width of several of tens of microseconds is usually applied to the gate in consideration of sufficient turn-on of the thyristor, because the turn-on times of the thyristors have dependency on variation of circuit elements and conditions for conduction. Accordingly, in the conventional narrow width gate-on pulse gate circuit, a gate signal having an unnecessarily wide pulse width is disadvantageously applied to the gate and excessive power consumption occurs.

An object of this invention is therefore to provide a gate circuit for thyristors which can reduce the conduction time of gate-on current applied to the thyristor to as small as necessary.

According to the invention, gate-on current is applied to the gate of a thyristor when anode-cathode voltage of the thyristor exceeds a predetermined level, and the gate-on current is turned off when the anode-cathode voltage falls below the predetermined level, so that the conduction time of the gate-on current applied to the thyristor can be made as small as necessary.

Thus, the invention can provide a gate circuit which minimizes power consumption in the gate.

Figure 1:
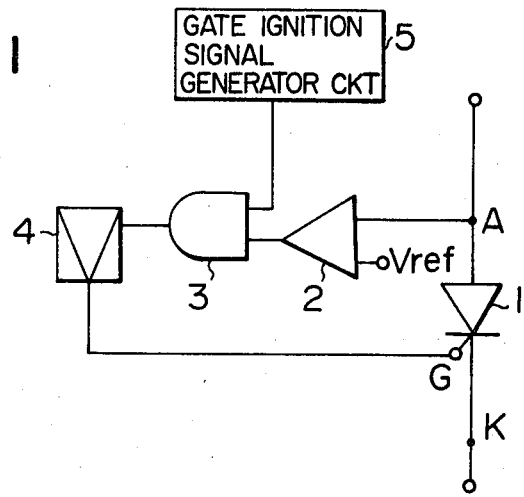
FIG. 1 is a circuit diagram of a gate circuit embodying the invention.

Referring to FIG. 1, there is shown a gate circuit for thyristors which embodies the invention.

In the figure, an anode A of a thyristor 1 is connected to one input terminal of a comparator 2, the other input terminal of which is applied with a preset voltage Vref. The preset voltage Vref determines the amount of reduction in anode voltage of thyristor 1 by which gate current is to be turned off. The comparitor 2 has an output terminal connected to one input terminal of an AND circuit 3, the other input terminal to which is applied a gate signal, produced from a gate ignition signal generator circuit 5. The AND circuit 3 has an output terminal connected to a pulse amplifier circuit 4. A pulse signal from the AND circuit 3 is amplified at the pulse amplifier circuit 4 and is then supplied, as gate current, to the gate of the thyristor 1.

Figure 2:
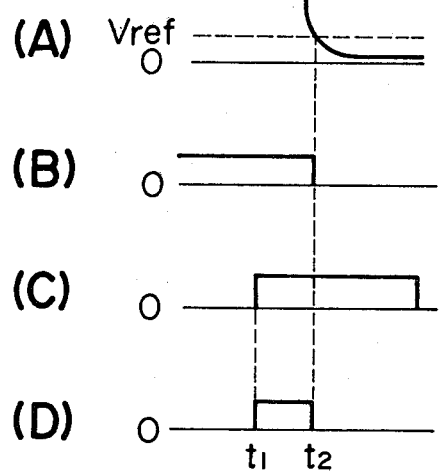
FIG. 2 shows waveforms in normal ignition with FIG. 1 circuit.

With this construction, when anode voltage of the thyristor 1 is sufficiently high as shown at section (A) in FIG. 2, the comparator 2 delivers out a gate-on pulse or a high level signal as shown at section (B) in FIG. 2. Thus, when a gate ignition signal as shown at (C) in FIG. 2 is produced from the gate ignition signal generator circuit 5, the high level signal is transmitted through the AND circuit 3 at time $t_1$ as shown at section (D) in FIG. 2 and applied, as gate current, via the pulse amplifier circuit 4 to the gate of the thyristor 1, thereby turning on the thyristor 1. Once the thyristor 1 is turned on, the anode voltage of the thyristor 1 begins to drop as shown at section (A) in FIG. 2 until, at time $t_2$, it decreases below the preset voltage Vref applied to the input terminal of the comparator 2. Then, the output signal of the comparator 2 becomes low as shown at section (B) in FIG. 2. As a result, even if the gate ignition signal from the gate ignition signal generator circuit 5 to the AND circuit 3 is high as shown at (C) in FIG. 2, gate current in the form of a narrow width pulse signal as shown at (D) in FIG. 2 is applied to the gate of the thyristor 1. The above occurs in the normal ignition operation.

Next, ignition operation for a lagging power factor load will be described.

Figure 3:
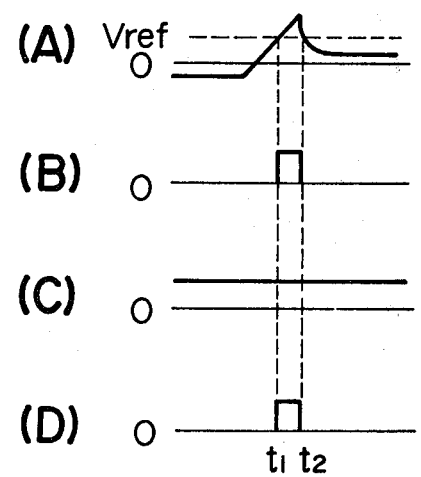
FIG. 3 shows waveforms in ignition when FIG. 1 circuit is connected with a load of a lagging power factor.

In the case of a lagging power factor load, anode voltage of the thyristor 1 is lower than the preset voltage Vref before time $t_1$ as shown at section (A) in FIG. 3 so that the output signal of the comparator 2 is low as shown at section (B) in FIG. 3, as a result, the output of the AND circuit 3 becomes low level even if the gate ignition signal is high as shown at section (C) in FIG. 3. However, when the anode voltage exceeds the preset voltage Vref at time $t_1$ as shown at (A) in FIG. 3, the output signal of the comparator 2 becomes high as shown at (B) in FIG. 3, giving rise to high level at the output of the AND circuit 3. Consequently, gate current as shown at section (D) in FIG. 3 is applied to the gate of the thyristor 1. Once the thyristor 1 is turned on, a voltage drop across the anode of the thyristor 1 occurs as shown at (A) in FIG. 3 and when the anode voltage falls below the preset voltage Vref at time $t_2$, the output signal of the comparator 3 assumes the low level as shown at (B) in FIG. 3, giving rise to low level of the output signal from the AND circuit 3. Consequently, gate current in the form of a narrow width pulse signal as shown at (D) in FIG. 3 is applied to the gate of the thyristor 1.

In this way, according to this embodiment, it is possible to minimize power consumption by detecting anode-cathode voltage of the thyristor 1 and anode voltage drop and turning off gate current.

This embodiment is also advantageous in that no mis-firing occur even in the case of a lagging power factor load.

Further, since, according to this embodiment, delivery of gate current to the thyristor is determined depending on whether the anode voltage of the thyristor is higher than the preset voltage Vref or not, the pulse width of gate current is reduced nearly to the time necessary for turning on the thyristor, thus minimizing power consumption.

Figure 4:
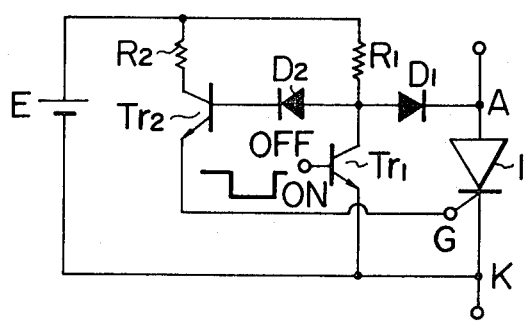
FIG. 4 is a circuit diagram showing another embodiment of the invention.

Turning to FIG. 4, another embodiment of the invention will be described.

In the figure, an anode A of a thyristor 1 is connected to a cathode of a diode $D_1$. The diode $D_1$ has an anode connected to a power supply E via a resistor $R_1$, to an anode of a diode $D_2$, and to a collector of a transistor $Tr_1$. The diode $D_2$ has a cathode connected to a base of a transistor $Tr_2$. This transistor $Tr_2$ has a collector connected to the power supply E via a resistor $R_2$ and an emitter connected to a gate G of the thyristor 1. The transistor $Tr_1$ has an emitter connected to a cathode K of the thyristor 1 which is connected to the power supply E. The base of the transistor $Tr_1$ is applied with a gate ignition signal from a gate ignition signal generator circuit not shown.

With this construction, when the thyristor 1 is turned off with forward voltage blocked, an inverse voltage is applied across the diode $D_1$. When the gate ignition signal (negative) is applied to the transistor $Tr_1$ to turn if off, base current flows into the transistor $Tr_2$ via the resistor $R_1$. The transistor $Tr_2$ is then turned on to allow gate-on current flow through a path "E-$R_2$-$Tr_2$-G-1-K-E". When the thyristor 1 is turned on and the anode voltage drops, the gate-on current does not flow into the gate G but by-passes a path "E-$R_1$-$D_1$-A", so that the transistor $Tr_2$ is turned off. In other words, supply of gate current is interrupted.

In this way, this embodiment attains the same effect as FIG. 1 embodiment.

Figure 5:
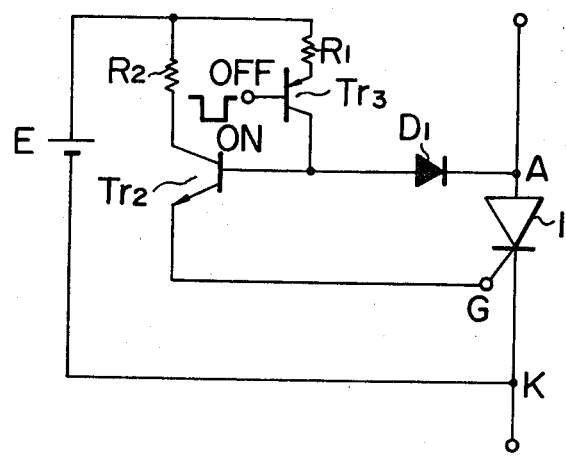
FIG. 5 is a circuit diagram showing still another embodiment of the invention.

FIG. 5 shows further embodiment of the invention.

This embodiment of FIG. 5 in which a PNP transistor $Tr_3$ substitutes for the diode $D_2$ and the transistor $Tr_1$ in FIG. 4 embodiment operates in the same manner as FIG. 4 embodiment, attaining the same effect.

Figure 6:
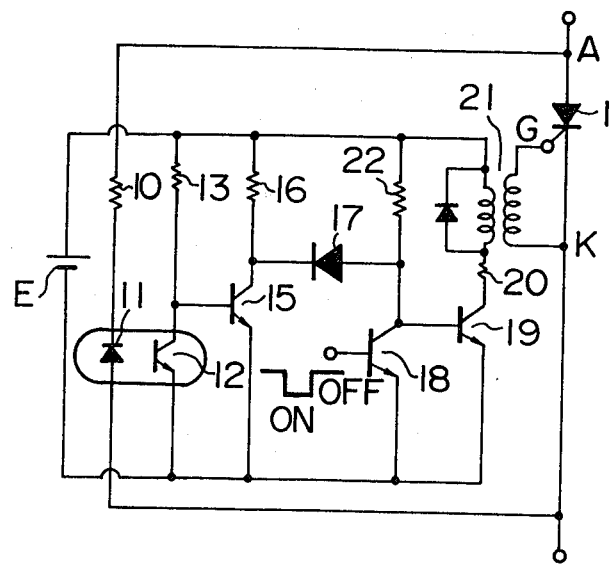
FIG. 6 is a circuit diagram showing yet another embodiment of the invention.

FIG. 6 shows still further embodiment of the invention.

As shown, a series circuit of a resistor 10 and a light emitting diode 11 is connected across anode and cathode of a thyristor 1. The light emitting diode 11 emits light as anode-cathode voltage of the thyristor 1 changes. A photo-transistor 12 associated with the light emitting diode 11 has a collector connected to a power supply E via a resistor 13 and to a base of a transistor 15. The photo-transistor 12 has an emitter connected to the power supply E. The transistor 15 has a collector connected to the power supply E via a resistor 16 and to a cathode of a diode 17. An emitter of the transistor 15 is connected to the power supply E.

The diode 17 has an anode connected to a resistor 22, a collector of a transistor 18 and a base of a transistor 19. The transistor 18 has an emitter connected to the power supply E and a base connected to receive a gate ignition signal for the thyristor 1. The collector of the transistor 18 is also connected via the resistor 22 to the power supply E. The transistor 19 has a collector connected via a resistor 20 to a pulse transformer 21 which in turn is connected with the power supply E. This pulse transformer 21 has a secondary coil connected across gate and cathode of the thyristor 1.

With this construction, the light emitting diode 11 emits light during the off state of the thyristor 1 and in this time the transistors 15 and 19 are in off state. When the base of the transistor 18 is supplied with the gate ignition signal (negative), the transistor 19 is turned on and then the current flows through the primary winding of the pulse transformer 21, so that the thyristor 1 is turned on. As a result, since the light emitting diode cannot emit light, the transistor 15 is turned on and the transistor 19 is turned off so as to turn off the gate current of the thyristor 1.

This embodiment attains the same effect as the previous embodiments.

While, in the foregoing embodiments, the gate circuits as applied to the thyristors have been described, the invention may also be applied to a gate turn-off thyristor in which anode current can be interrupted by gate current. The gate turn-off thyristor has a minimum gate ignition current which is larger than that of the thyristor. Accordingly, the effect of reducing power consumption in the gate circuit by the narrow width pulse is considerable.

For example, let I, E, $T_{ON}$ and T be a minimum ignition gate current, a gate-on voltage, a conduction time, and a period, respectively. Then, a power consumption P in the gate circuit is expressed as, $$P = I \times E \times T_{ON}/T$$

For a narrow width pulse, $T_{ON}$ is several microseconds. Accordingly, when it is assumed that conduction ratio is 50% at 1 KHz and $T_{ON} = 500$ μs, power consumption in the gate circuit can be reduced by about 1/20 by replacing the wide width gate-on pulse gate circuit with the narrow width gate-on pulse gate circuit according to the invention.

What is claimed is:

1. A gate circuit for a thyristor comprising a power supply for feeding gate-on current through a gate and cathode of said thyristor, a switching circuit connected in series with the power supply to turn the gate-on current on or off, a diode connected between a gate ignition signal input terminal of said switching circuit and the anode of said thyristor with the cathode of said diode coupled to said anode of said thyristor and the anode of said diode coupled to said switching circuit.

2. A gate circuit according to claim 1, wherein said switching circuit is a transistor having an emitter coupled to said gate of said thyristor, a collector coupled to a positive terminal of said power supply and a base coupled to said gate ignition signal input terminal.

3. A gate circuit according to claim 2, further comprising a second switching circuit coupled between the cathode of said thyristor and said gate ignition signal input terminal, said second switching circuit being turned on or off by the gate ignition signal, and there being a resistor connected between the positive terminal of said power supply and said gate ignition signal input terminal.

4. A gate circuit according to claim 2, further comprising a series circuit in which a second switching element is connected in series with a resistor between the positive terminal of said power supply and said gate ignition signal input terminal.

5. A gate circuit according to claim 4 in which said thyristor is a gate turn-off thyristor.

6. A gate circuit according to claim 3 in which said thyristor is a gate turn-off thyristor.

* * * * *